(12) United States Patent
Okamoto

(10) Patent No.: US 9,569,111 B2
(45) Date of Patent: *Feb. 14, 2017

(54) MEMORY SYSTEM

(71) Applicant: Kabushiki Kaisha Toshiba, Minato-ku (JP)

(72) Inventor: Shinken Okamoto, Shizuoka (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/135,953

(22) Filed: Apr. 22, 2016

(65) Prior Publication Data

US 2016/0239214 A1    Aug. 18, 2016

Related U.S. Application Data

(63) Continuation of application No. 14/677,361, filed on Apr. 2, 2015, now Pat. No. 9,348,699, which is a (Continued)

(30) Foreign Application Priority Data

Feb. 10, 2010 (JP) ................... 2010-027944

(51) Int. Cl.
| | |
|---|---|
| *G11C 16/14* | (2006.01) |
| *G11C 16/16* | (2006.01) |
| *G11C 29/04* | (2006.01) |
| *G06F 3/06* | (2006.01) |
| *G06F 12/02* | (2006.01) |
| *G06F 11/10* | (2006.01) |
| *G06F 11/30* | (2006.01) |
| *G11C 29/50* | (2006.01) |
| *G11C 16/34* | (2006.01) |

(52) U.S. Cl.
CPC ............ *G06F 3/0605* (2013.01); *G06F 3/064* (2013.01); *G06F 3/0619* (2013.01);
(Continued)

(58) Field of Classification Search
CPC ..... G11C 16/14; G11C 16/16; G11C 16/3445; G11C 16/349
(Continued)

(56) References Cited

U.S. PATENT DOCUMENTS 6,330,189 B1 * 12/2001 Sakui ................ G11C 16/3454
                                                        365/185.17
6,993,690 B1 *  1/2006 Okamoto .......... G11C 16/3418
                                                        365/185.33
(Continued)

FOREIGN PATENT DOCUMENTS

JP      6-52694     2/1994
JP      9-305497    11/1997
(Continued)

*Primary Examiner* — Ly D Pham
(74) *Attorney, Agent, or Firm* — Oblon, McClelland, Maier & Neustadt, L.L.P.

(57) ABSTRACT

According to the embodiments, a memory system includes a nonvolatile semiconductor memory and a writing-loop-count monitoring unit that monitors a loop count of an applied voltage to the nonvolatile semiconductor memory required for data writing of the nonvolatile semiconductor memory as a writing loop count. Moreover, the memory system includes a management table for managing the writing loop count in block unit that is a unit of data erasing and a life managing unit that determines a degraded state of the nonvolatile semiconductor memory based on the management table.

20 Claims, 13 Drawing Sheets

Related U.S. Application Data continuation of application No. 14/300,784, filed on Jun. 10, 2014, now Pat. No. 9,053,016, which is a continuation of application No. 14/070,020, filed on Nov. 1, 2013, now abandoned, which is a continuation of application No. 12/886,260, filed on Sep. 20, 2010, now Pat. No. 8,605,504.

(52) U.S. Cl.
CPC .......... *G06F 3/0653* (2013.01); *G06F 3/0659* (2013.01); *G06F 3/0679* (2013.01); *G06F 11/1072* (2013.01); *G06F 11/1084* (2013.01); *G06F 11/3034* (2013.01); *G06F 12/0246* (2013.01); *G11C 29/50004* (2013.01); *G06F 2212/7207* (2013.01); *G06F 2212/7211* (2013.01); *G11C 16/14* (2013.01); *G11C 16/16* (2013.01); *G11C 16/349* (2013.01); *G11C 16/3445* (2013.01); *G11C 2029/5004* (2013.01)

(58) Field of Classification Search
USPC ............ 365/185.09, 185.11, 185.19, 185.29
See application file for complete search history.

(56) References Cited

U.S. PATENT DOCUMENTS

| | | | | |
|---|---|---|---|---|
| 7,356,442 | B1* | 4/2008 | Astigarraga | G06F 11/008 702/182 |
| 7,639,548 | B1* | 12/2009 | Walker | G01K 7/425 365/189.09 |
| 8,190,795 | B2* | 5/2012 | Hinohara | G06F 9/5016 710/56 |
| 8,479,080 | B1* | 7/2013 | Shalvi | G06F 11/10 365/185.09 |
| 2003/0235080 | A1* | 12/2003 | Yaegashi | G11C 16/3468 365/185.22 |
| 2007/0255889 | A1* | 11/2007 | Yogev | G06F 12/0246 711/103 |
| 2009/0154242 | A1* | 6/2009 | Janai | G11C 29/70 365/185.09 |
| 2009/0248922 | A1* | 10/2009 | Hinohara | G06F 9/5016 710/56 |
| 2010/0110796 | A1* | 5/2010 | Park | G11C 16/344 365/185.19 |
| 2011/0197045 | A1* | 8/2011 | Okamoto | G06F 12/0246 711/166 |
| 2012/0033503 | A1* | 2/2012 | Kim | G11C 16/16 365/185.33 |
| 2012/0268994 | A1* | 10/2012 | Nagashima | G06F 11/1048 365/185.11 |
| 2013/0007543 | A1* | 1/2013 | Goss | G11C 16/3418 714/718 |
| 2014/0122787 | A1* | 5/2014 | Shalvi | G06F 11/10 711/103 |

FOREIGN PATENT DOCUMENTS

| | | |
|---|---|---|
| JP | 2716906 | 11/1997 |
| JP | 9-330598 | 12/1997 |
| JP | 11-250675 | 9/1999 |
| JP | 2008-139927 | 6/2008 |

* cited by examiner

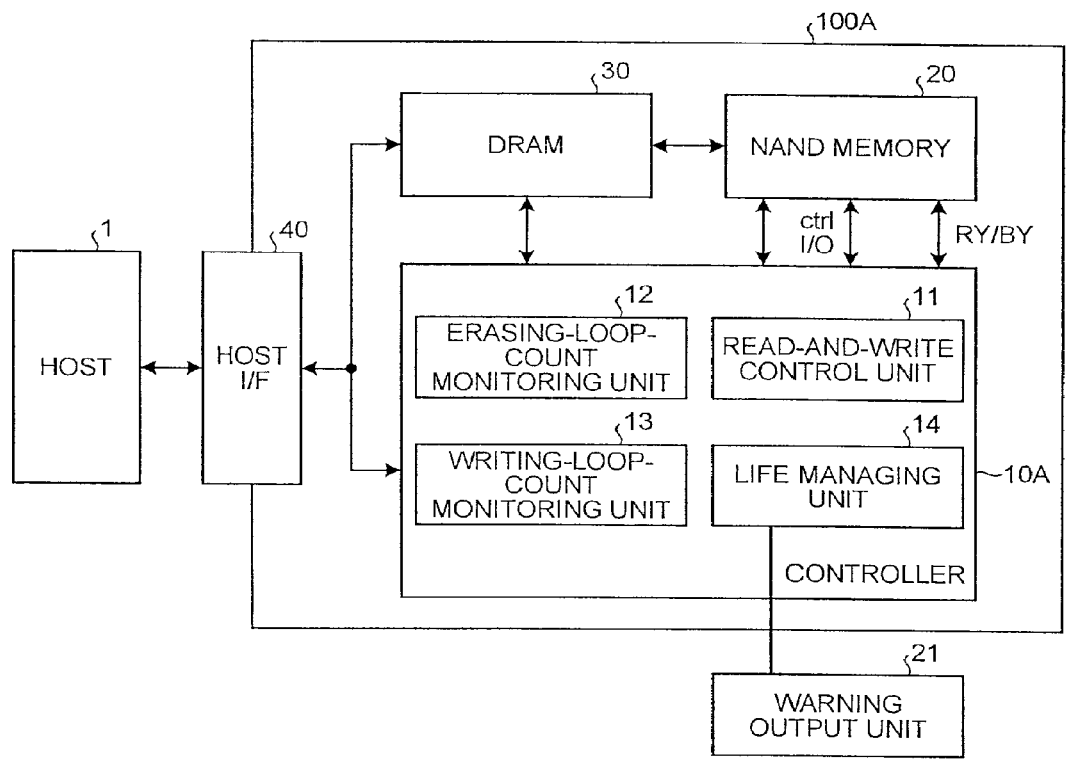

| ALLOWABLE RANGE OF WRITING LOOP COUNT Lw || ALLOWABLE RANGE OF ERASING LOOP COUNT Le ||
|---|---|---|---|
| LOWER LIMIT | UPPER LIMIT | LOWER LIMIT | UPPER LIMIT |
| Wmin | Wmax | Emin | Emax |

FIG.16

| BLOCK ID | WRITING LOOP COUNT AVERAGE VALUE La | NUMBER OF WRITTEN PAGES P | ERASING LOOP COUNT Le |
|---|---|---|---|
| 1 | ... | ... | ... |
| 2 | ... | ... | ... |
| ⋮ | ⋮ | ⋮ | ⋮ |

FIG.17

| FIRST ALLOWABLE RANGE OF WRITING LOOP COUNT Lw | | SECOND ALLOWABLE RANGE OF WRITING LOOP COUNT Lw | | FIRST ALLOWABLE RANGE OF ERASING LOOP COUNT Le | | SECOND ALLOWABLE RANGE OF ERASING LOOP COUNT Le | |
|---|---|---|---|---|---|---|---|
| FIRST LOWER LIMIT | FIRST UPPER LIMIT | SECOND LOWER LIMIT | SECOND UPPER LIMIT | FIRST LOWER LIMIT | FIRST UPPER LIMIT | SECOND LOWER LIMIT | SECOND UPPER LIMIT |
| Wmin1 | Wmax1 | Wmin2 | Wmax2 | Emin1 | Emax1 | Emin2 | Emax2 |

MEMORY SYSTEM

CROSS-REFERENCE TO RELATED APPLICATIONS

This application is a continuation of U.S. Ser. No. 14/677,361, filed Apr. 2, 2015, which is a continuation of U.S. Ser. No. 14/300,784, filed Jun. 10, 2014 (now U.S. Pat. No. 9,053,016), which is a continuation of U.S. Ser. No. 14/070,020, filed Nov. 1, 2013, which is a continuation of U.S. Ser. No. 12/886,260 filed Sep. 20, 2010 (now U.S. Pat. No. 8,605,504), issued Dec. 12, 2013, which claims priority under 35 U.S.C. 119 to Japanese Patent Application No. 2010-27944, filed on Feb. 10, 2010; the entire contents of which are incorporated herein by reference.

FIELD

The present embodiments typically relate to a memory system.

BACKGROUND

A NAND-type flash memory is a semiconductor memory that needs erase processing before performing writing. In writing/erasing of data in the NAND-type flash memory, electrons are injected/removed in/from a floating gate by applying a high voltage between a substrate and a control gate. It is known that when the writing/erasing is performed many times, a gate oxide film around the floating gate is degraded, which adversely affects writing/erasing characteristics closely related to a life of the NAND-type flash memory. Therefore, it is desired to correctly recognize the life of the NAND-type flash memory.

BRIEF DESCRIPTION OF THE DRAWINGS

FIG. 5 is a functional block diagram illustrating a functional configuration example of an SSD according to the first embodiment;

FIG. 6 is a diagram illustrating management data of a loop number management table;

FIG. 16 is a diagram illustrating another configuration example of the loop number management table; and FIG. 17 is a diagram illustrating block threshold information when the state determination of a block is performed in two stages.

DETAILED DESCRIPTION

According to embodiments, a memory system includes a nonvolatile semiconductor memory that includes a plurality of blocks as a unit of data erasing. Moreover, the memory system includes a writing-loop-count monitoring unit that monitors a loop count of an applied voltage to the nonvolatile semiconductor memory required for data writing of the nonvolatile semiconductor memory as a writing loop count. Furthermore, the memory system includes a management table for managing the writing loop count in block unit and a life managing unit that determines a degraded state of the nonvolatile semiconductor memory based on the management table.

A memory system according to the embodiments will be explained below in detail with reference to the drawings. The present invention is not limited to these embodiments.

(First Embodiment)

In the present embodiment, a loop count of an applied voltage in writing or erasing to a memory cell of a NAND-type flash memory is detected for determining a life (degraded state) of an SSD (Solid State Drive) that includes the NAND-type flash memory as one example of a nonvolatile semiconductor memory. The loop count in this example is the number of pulses (number of voltage applications) of a voltage applied to the NAND-type flash memory in writing or erasing to the NAND-type flash memory. In writing or erasing, a predetermined voltage is applied to the NAND-type flash memory a plurality of times (for the loop count) while gradually increasing the voltage.

After detecting the loop count of the applied voltage, the loop count is compared with a preset setting value (predetermined threshold), and the degraded state of each block in the NAND-type flash memory is determined based on this comparison result. Moreover, the degraded state of the SSD (whole memory system including a plurality of the nonvolatile semiconductor memories) is determined by using the determination result of the degraded state. In the following explanation, the NAND-type flash memory is referred to as a NAND memory.

First, explanation is given for the configuration of the memory system that includes the SSD, the configuration of the NAND memory, and the like with reference to FIG. 1 to FIG. 4, and thereafter, the configuration, the operation, and the like of the SSD that are one of characteristics of the present embodiment are explained with reference to FIG. 5 to FIG. 13.

Figure 1:
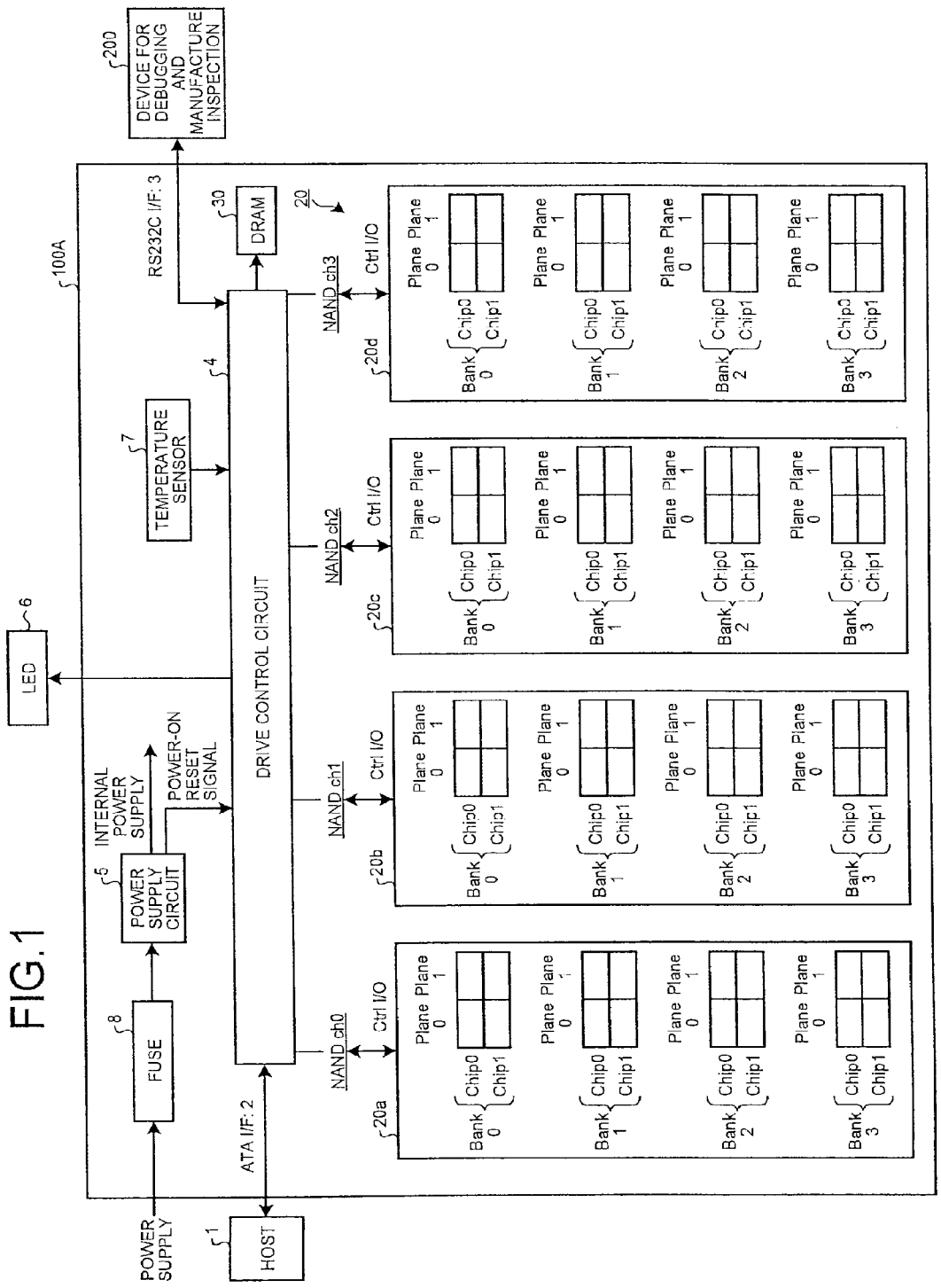
FIG. 1 is a configuration diagram illustrating a memory system according to a first embodiment.

FIG. 1 is a block diagram illustrating a configuration example of an SSD 100A as the memory system. The SSD 100A includes a host connection interface (host I/F 40 to be described later) for connecting to a host device (hereinafter, host) 1. FIG. 1 illustrates a case where the host I/F 40 is a memory connection interface such as an ATA interface (ATA I/F) 2. The SSD 100A is connected to the host 1 such as a personal computer and a CPU core via the ATA I/F 2 (the host I/F 40) and functions as an external memory of the host 1. The SSD 100A can transmit and receive data to and from a device for debugging and manufacture inspection 200 via a communication interface 3 such as an RS232C interface (RS232C I/F).

The SSD 100A includes a NAND-type flash memory (hereinafter, NAND memory) 20 as the nonvolatile semiconductor memory, a drive control circuit 4 as a controller, a DRAM 30 as a volatile semiconductor memory, a power supply circuit 5, a state display LED 6, a temperature sensor 7 that detects the temperature in a drive, and a fuse 8.

The power supply circuit 5 generates a plurality of different internal direct current power-supply voltages from an external direct current power supply supplied from a power supply circuit on the host 1 side, and supplies these internal direct current power-supply voltages to respective circuits in the SSD 100A. The power supply circuit 5 detects a rising edge of an external power supply, generates a power-on reset signal, and supplies it to the drive control circuit 4.

The fuse 8 is provided between the power supply circuit on the host 1 side and the power supply circuit 5 in the SSD 100A. When an overcurrent is supplied from an external power supply circuit, the fuse 8 is disconnected to prevent malfunction of an internal circuit.

The NAND memory 20, for example, includes four parallel operation elements 20a to 20d that perform four parallel operations, and the four parallel operation elements 20a to 20d are connected to the drive control circuit 4 by four channels (ch0 to ch3). Each of the parallel operation elements 20a to 20d includes a plurality of banks capable of performing bank interleave. In other words, each parallel operation element, for example, includes four banks (Bank 0 to Bank 3), and each bank includes a plurality of NAND memory chips, for example, two memory chips (Chip 0 and Chip 1).

Each memory chip, for example, is divided into two districts of a plane 0 and a plane 1 each of which includes a plurality of physical blocks. The plane 0 and the plane 1 include peripheral circuits independent from each other (for example, row decoder, column decoder, page buffer, and data cache) and can perform erasing/writing/reading simultaneously by using a double speed mode.

In this manner, each NAND memory chip of the NAND memory 20 can perform the parallel operation by a plurality of channels, the bank interleave operation by a plurality of banks, the interleave operation by a plurality of chips in the same bank, and the parallel operation by the double speed mode by using a plurality of planes. It is applicable that each memory chip is configured to be divided into two or more planes or is not divided.

The DRAM 30 functions as a data transfer cache, a work area memory, and the like between the host 1 and the NAND memory 20. The content stored in the work area memory of the DRAM 30 is, for example, a master table (snapshot) obtained by loading various management tables stored in the NAND memory 20 at the time of start-up or a change difference (log information) of the management tables stored in the NAND memory 20.

It is possible to use a nonvolatile random access memory such as an FeRAM (Ferroelectric Random Access Memory), an MRAM (Magnetoresistive Random Access Memory), and a PRAM (Phase change Random Access Memory) instead of the DRAM 30. When the nonvolatile random access memory is used, it is possible to omit part of or all of operations of saving various management tables and the like to the NAND memory 20 at the time of disconnecting the power supply.

The drive control circuit 4 performs a data transfer control between the host 1 and the NAND memory 20 via the DRAM 30 and controls each component in the SSD 100A. Moreover, the drive control circuit 4 has a function of supplying a status display signal to the state display LED 6 and, upon receiving the power-on reset signal from the power supply circuit 5, supplying a reset signal and a clock signal to each unit in the drive control circuit 4 and the SSD 100A.

Each NAND memory chip is configured by arranging a plurality of the physical blocks as a unit of data erasing.

Figure 2A:
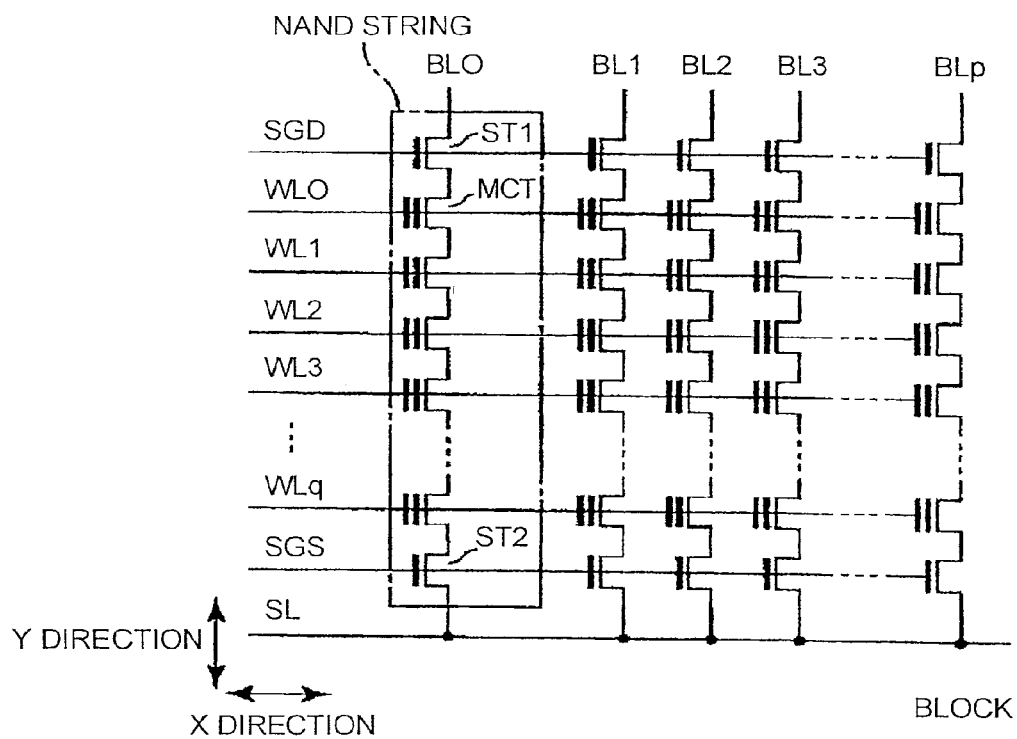
FIG. 2A is a circuit diagram illustrating an example of a physical block included in a NAND memory chip.

FIG. 2A is a circuit diagram illustrating a configuration example of one physical block included in the NAND memory chip. Each physical block includes (p+1) NAND strings arranged in order along an X direction (p is an integer equal to or larger than 0). Selection transistors ST1 included in respective NAND strings are such that drains are connected to bit lines BL0 to BLp and gates are connected in common to a selection gate line SGD. Selection transistors ST2 are such that sources are connected in common to a source line SL and gates are connected in common to a selection gate line SGS.

Each memory cell transistor (also called memory cell) MCT includes a MOSFET (Metal Oxide Semiconductor Field Effect Transistor) having a stacked gate structure formed on a semiconductor substrate. The stacked gate structure includes a charge storage layer (floating gate electrode) formed on the semiconductor substrate via a gate dielectric film and a control gate electrode formed on the charge storage layer via an inter-gate dielectric film. In the memory cell transistor MCT, a threshold voltage changes depending on the number of electrons accumulated in the floating gate electrode and data is stored in accordance with the difference of this threshold voltage. The memory cell transistor MCT can be configured to store 1 bit or multiple values (data equal to or larger than 2 bits).

The memory cell transistor MCT is not limited to the structure having the floating gate electrode and can have a structure, such as a MONOS (Metal-Oxide-Nitride-Oxide-Silicon) type, in which the threshold voltage can be adjusted by trapping electrons in a nitride film interface as the charge storage layer. In the similar manner, the memory cell transistor MCT having the MONOS structure can be configured to store 1 bit or multiple values (data equal to or larger than 2 bits).

In each NAND string, (q+1) memory cell transistors MCT are arranged so that current paths thereof are connected in series between the source of the selection transistor ST1 and the drain of the selection transistor ST2. In other words, the memory cell transistors MCT are connected in series in a Y direction in the form in which adjacent ones share a diffusion region (source region or drain region).

In each NAND string, the control gate electrodes are connected to the word lines WL0 to WLq, respectively, in order from the memory cell transistor MCT located on the most drain side. Therefore, the drain of the memory cell transistor MCT connected to the word line WL0 is connected to the source of the selection transistor ST1, and the source of the memory cell transistor MCT connected to the word line WLq is connected to the drain of the selection transistor ST2.

Each of the word lines WL0 to WLq connects the control gate electrodes of the memory cell transistors MCT in common among the NAND stings in the physical block. In other words, the control gate electrodes of the memory cell transistors MCT present in the same row in the block are connected to the same word line WL. (p+1) memory cell transistors MCT connected to this same word line WL are treated as one page (physical page) and data writing and data reading are performed for each physical page.

Each of the bit lines BL0 to BLp connects the drains of the selection transistors ST1 in common among blocks. In other words, the NAND strings present in the same column in a plurality of blocks are connected to the same bit line BL.

Figure 2B:
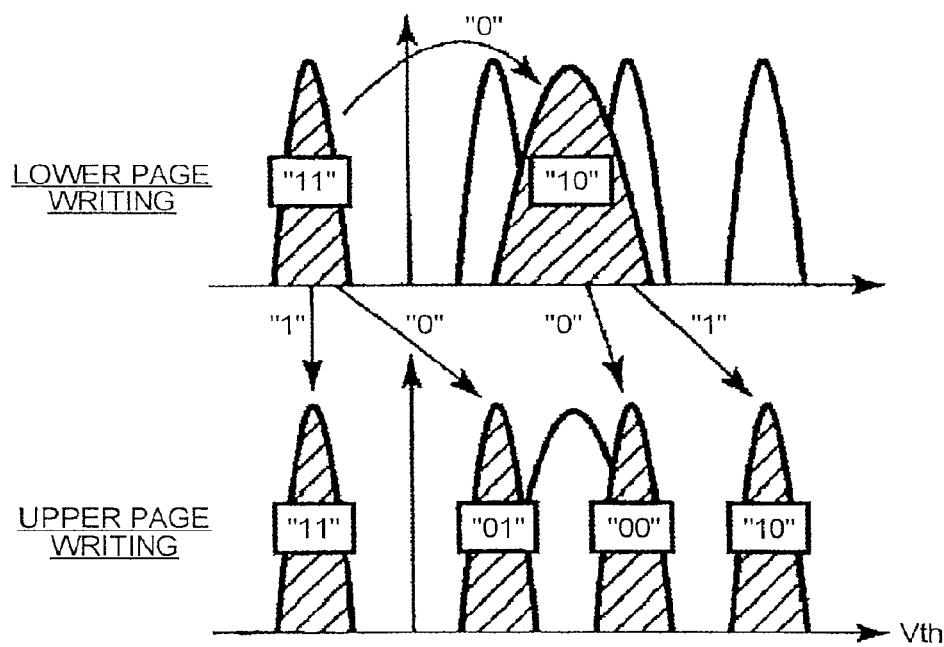
FIG. 2B is a schematic diagram illustrating an example of a threshold distribution of a memory cell transistor.

FIG. 2B is a schematic diagram illustrating a threshold distribution, for example, in a quaternary data storage mode for storing 2 bits in one memory cell transistor MCT. In the quaternary data storage mode, any one of quaternary data "xy" defined by upper page data "x" and lower page data "y" can be stored in the memory cell transistor MCT.

As the quaternary data "xy", for example, pieces of data "11", "01", "00 ", and "10 " are allocated in order of the threshold voltage of the memory cell transistor MCT. The data "11 " indicates an erased state in which the threshold voltage of the memory cell transistor MCT is, for example, negative. The allocation rule of data is not limited thereto. The configuration can be such that storage of 3 or more bits is performed in one memory cell transistor MCT.

In a lower page writing operation, lower bit data "y" is selectively written in the memory cell transistor MCT having the data "11 " (erased state), so that the data "10 " is written. The threshold distribution of the data "10 " before upper page writing is located about in the middle of the threshold distributions of the data "01 " and the data "00 " after the upper page writing, and can be broader than the threshold distribution after the upper page writing. In the upper page writing operation, upper bit data "x" is selectively written in each of the memory cell of the data "11 " and the memory cell of the data "10 ", so that the data "01 " and the data "00 " are written. In a pseudo SLC mode, writing is performed using only the lower page. The lower page writing is faster than the upper page writing.

Figure 3:
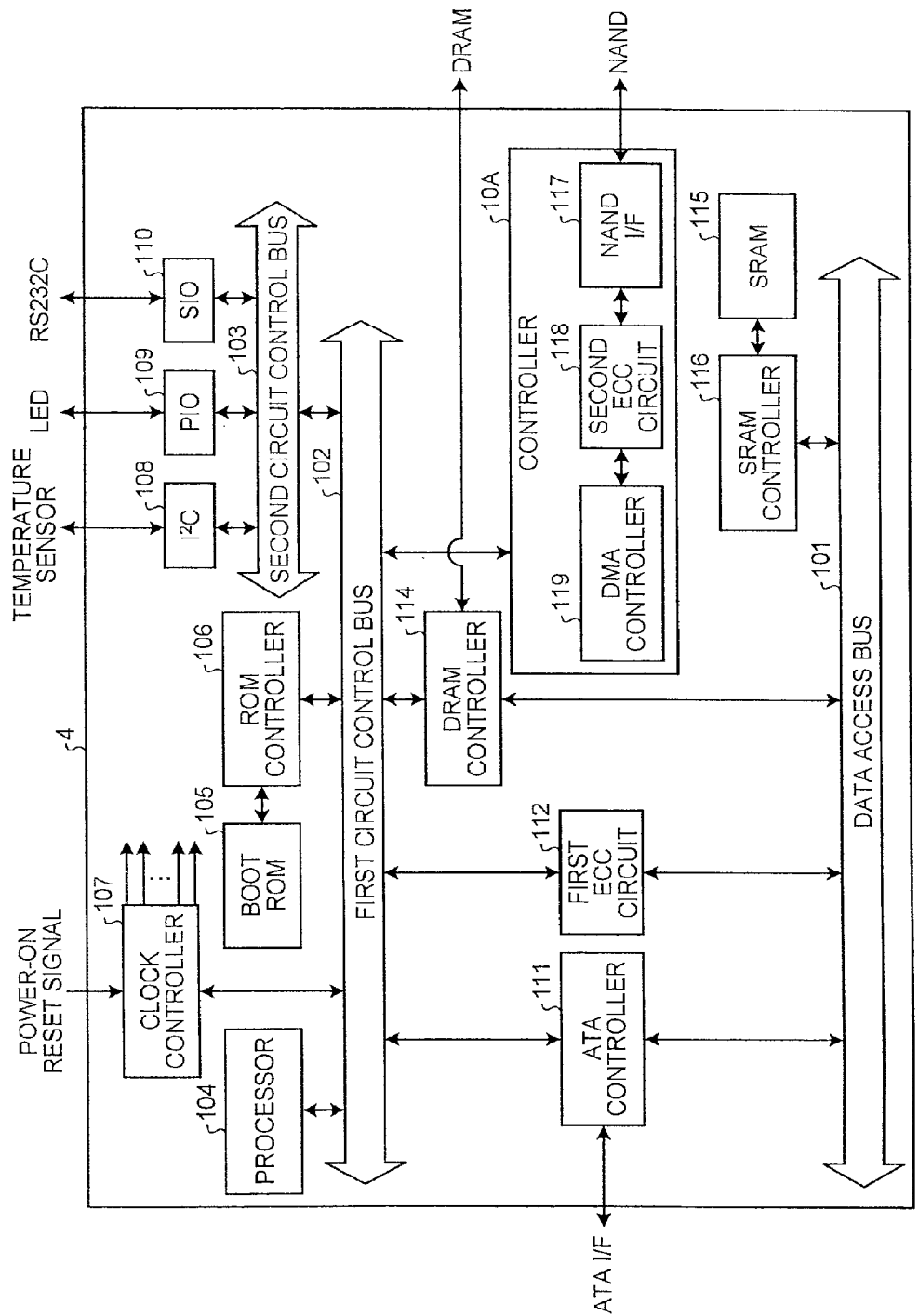
FIG. 3 is a configuration diagram illustrating one example of a drive control circuit shown in FIG. 1.

FIG. 3 is a block diagram illustrating a hardware internal configuration example of the drive control circuit 4. The drive control circuit 4 includes a data access bus 101, a first circuit control bus 102, and a second circuit control bus 103. A processor 104 that controls the entire drive control circuit 4 is connected to the first circuit control bus 102. A boot ROM 105 is connected to the first circuit control bus 102 via a ROM controller 106. In the boot ROM 105, a boot program for booting each management program (FM: firmware) stored in the NAND memory 20 is stored.

Moreover, a clock controller 107 is connected to the first circuit control bus 102. This clock controller 107 receives the power-on reset signal from the power supply circuit 5 shown in FIG. 1 and supplies the reset signal and the clock signal to each unit.

The second circuit control bus 103 is connected to the first circuit control bus 102. An I²C circuit 108 for receiving data from the temperature sensor 7 shown in FIG. 1, a parallel IO (PIO) circuit 109 that supplies the status display signal to the state display LED 6, and a serial IO (SIO) circuit 110 that controls the RS 232C I/F 3 are connected to the second circuit control bus 103.

An ATA interface controller (ATA controller) 111, a first ECC (Error Checking and Correction) circuit 112, a controller 10A that is a NAND controller, and a DRAM controller 114 are connected to both of the data access bus 101 and the first circuit control bus 102. The ATA controller 111 transmits and receives data to and from the host 1 via the ATA I/F 2. An SRAM 115 that is used as a data work area and a firmware loading area is connected to the data access bus 101 via an SRAM controller 116. When the firmware stored in the NAND memory 20 is started, the firmware is transferred to the SRAM 115 by the boot program stored in the boot ROM 105.

The controller 10A includes a NAND I/F 117, a second ECC circuit 118, and a DMA controller 119 for DRAM transfer control. The NAND I/F 117 performs interface processing for interface with the NAND memory 20. The DMA controller 119 for DRAM transfer control performs an access control between the NAND memory 20 and the DRAM 30. The second ECC circuit 118 performs encoding of a second correction code or performs encoding and decoding of a first error correction code. The first ECC circuit 112 performs decoding of a second error correction code. The first error correction code and the second error correction code are, for example, a Hamming code, a BCH (Bose Chaudhuri Hocquenghem) code, an RS (Reed Solomom) code, or an LDPC (Low Density Parity Check), and a correction ability of the second error correction code is higher than the correction ability of the first error correction code.

As shown in FIG. 1, in the NAND memory 20, the four parallel operation elements 20a to 20d are connected in parallel to the first ECC circuit 112 in the drive control circuit 4 via four channels each for a plurality of bits. Therefore, the four parallel operation elements 20a to 20d can be operated in parallel. Moreover, the NAND memory 20 of each channel is divided into four banks capable of the bank interleave. Therefore, simultaneous access to the plane 0 and the plane 1 of each memory chip can be performed. Thus, eight physical blocks (4 banks×2 planes) can be controlled almost simultaneously at a maximum per channel. In other words, it is possible to perform processing such as writing to the maximum of eight physical blocks simultaneously.

Figure 4:
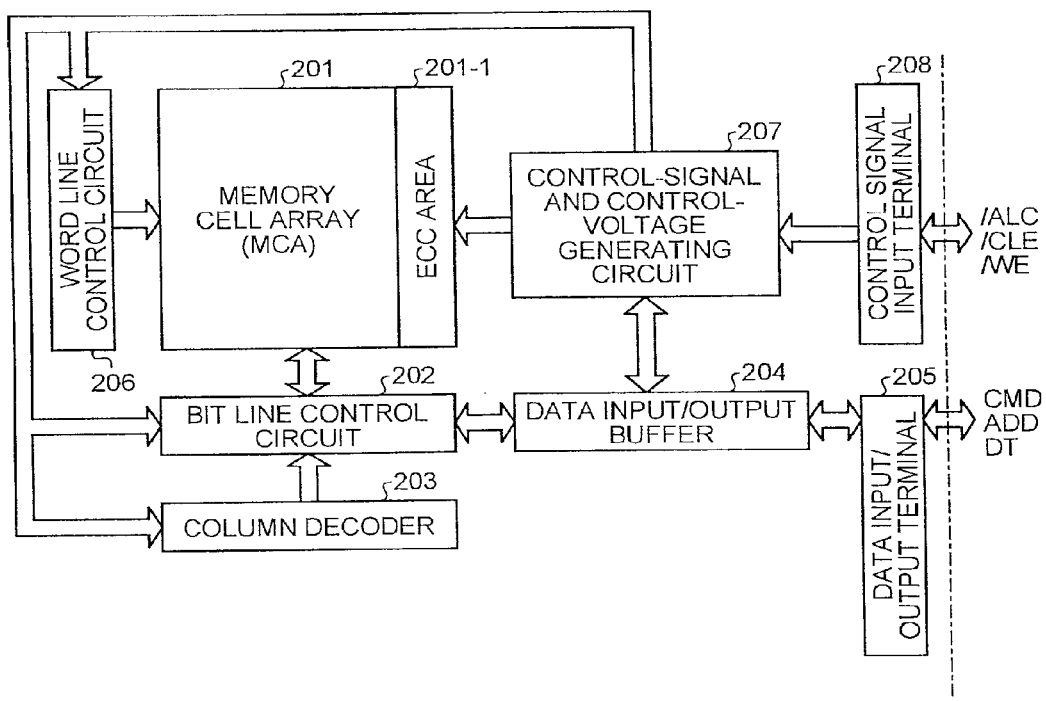
FIG. 4 is a diagram illustrating one example of a NAND-type flash memory included in one chip shown in FIG. 1.

FIG. 4 is a functional block diagram illustrating one example of one NAND memory chip (NAND-type flash memory) shown in FIG. 1.

A memory cell array 201 includes a plurality of bit lines, a plurality of word lines, and a common source line, in which memory cells each of which is composed of, for example, an EEPROM cell and is capable of electrically rewriting data are arranged in a matrix manner. A bit line control circuit 202 for controlling the bit line and a word line control circuit 206 are connected to this memory cell array 201.

The bit line control circuit 202 reads out data of the memory cell in the memory cell array 201 via the bit line, detects a state of the memory cell in the memory cell array 201 via the bit line, and performs writing to the memory cell by applying a write control voltage to the memory cell in the memory cell array 201 via the bit line. A column decoder 203 and a data input/output buffer 204 are connected to the bit line control circuit 202.

A data storage circuit in the bit line control circuit 202 is selected by the column decoder 203. Data of the memory cell read out to the data storage circuit is output to the outside from a data input/output terminal 205 via the data input/output buffer 204. The data input/output terminal 205 is connected to the drive control circuit 4 outside of the memory chip.

This drive control circuit 4 receives data output from the data input/output terminal 205. Moreover, the drive control circuit 4 outputs various commands CMD that control the operation of the NAND-type flash memory, an address ADD, and a data DT. Write data input to the data input/ output terminal 205 from the drive control circuit 4 is supplied to the data storage circuit selected by the column decoder 203 via the data input/output buffer 204, and a command and an address are supplied to a control-signal and control-voltage generating circuit 207.

The word line control circuit 206 is connected to the memory cell array 201. This word line control circuit 206 selects the word line in the memory cell array 201 and applies a voltage necessary for reading, writing, or erasing to the selected word line.

The memory cell array 201, the bit line control circuit 202, the column decoder 203, the data input/output buffer 204, and the word line control circuit 206 are connected to the control-signal and control-voltage generating circuit 207 and are controlled by this control-signal and control-voltage generating circuit 207.

The control-signal and control-voltage generating circuit 207 is connected to a control signal input terminal 208 and is controlled by various control signals, such as ALE (address latch enable), CLE (command latch enable), WE (write enable), input from the drive control circuit 4 via the control signal input terminal 208, and the command CMD input from the drive control circuit 4 via the data input/output terminal 205 and the data input/output buffer 204.

This control-signal and control-voltage generating circuit 207 generates a voltage supplied to the word line and the bit line at the time of data writing and generates a voltage supplied to a well. The control-signal and control-voltage generating circuit 207, for example, includes a boot circuit such as a charge pump circuit, and can generate a program voltage, a read voltage, or an erase voltage.

Moreover, as will be described later, the control-signal and control-voltage generating circuit 207 can change the level of the read voltage. In other words, the control-signal and control-voltage generating circuit 207 has a function of receiving various control signals input via the control signal input terminal 208 and the command CMD input via the data input/output terminal 205 and the data input/output buffer 204 and shifting a voltage applied to the word line at the time of the read operation to a + direction or a − direction.

The bit line control circuit 202, the column decoder 203, the word line control circuit 206, and the control-signal and control-voltage generating circuit 207 constitute a write circuit and a read circuit.

The memory cell array 201 includes a storage area 201-1 that stores an ECC (Error Correction Code) in addition to a storage area for storing main data.

In the SSD 100A, when the number of times of writing or the number of times of erasing increases, electrons are trapped in the gate oxide film of the cell included in the NAND memory 20. Therefore, for removing the electrons from the gate oxide film at the time of erasing, a large number of applications of a high voltage are needed with the increase of the number of times of erasing. Moreover, the threshold of the cell appears high due to the electrons trapped in the gate oxide film, so that writing is finished with a small number of voltage applications. Therefore, a correlation exists between the number of voltage applications and an actual degradation of the cell, so that the life of the NAND memory 20 is detected by utilizing this correlation in the present embodiment.

Next, the configuration and the operation of the SSD 100A in the present embodiment are explained. FIG. 5 is a functional block diagram illustrating a functional configuration example of the SSD as the memory system according to the first embodiment of the present invention. The SSD 100A includes the controller 10A, the NAND memory 20, the DRAM 30, the host I/F 40 for connecting to the host 1, and a warning output unit 21.

The NAND memory 20 stores user data specified by the host 1 and stores management information managed in the DRAM 30 for backup. The NAND memory 20 includes a memory cell array in which a plurality of the memory cells is arranged in a matrix manner, and each memory cell can perform multi-value storage by using the upper page and the lower page. The NAND memory 20 includes a plurality of the NAND memory chips and each NAND memory chip is configured by arranging a plurality of the physical blocks as a unit of data erasing. Moreover, in the NAND memory 20, data writing and data reading are performed for each physical page. The physical block includes a plurality of the physical pages.

A physical block address is a fixed address allocated to the physical block. A logical block address is an address specified from the host 1 or a changeable address allocated to a logical block that is a virtual block. The logical block is, for example, a virtual block constituted by combining a plurality of the physical blocks.

The DRAM 30 is used as a storage unit for a data transfer and a management information recording. Specifically, the storage unit (data transfer cache region) for the data transfer is used for temporarily storing data for which a write request is made from the host 1 before writing in the NAND memory 20 and reading out data for which a read request is issued from the host 1 from the NAND memory 20 and temporarily storing it. The storage unit for the management information recording is used for storing various management information including management information (such as correlation between logical address and physical address) for managing a storage position of data stored in the NAND memory 20 and management information (loop count management table 31) for managing a writing loop count Lw and an erasing loop count Le to be described later in physical block unit.

The loop count management table (writing/erasing loop count management table) 31 as shown in FIG. 6 is stored in the NAND memory 20, and the loop count management table 31 is read out from the NAND memory 20 and is stored in the DRAM 30 at the time of system start-up. The loop count management table 31 is a table for managing the writing loop count Lw that is the loop count at the time of writing and the erasing loop count Le that is the loop count at the time of erasing in physical block unit (in physical block address unit). As the writing loop count Lw, the loop count (worst value) (page whose aging change is the largest) of a page with the minimum writing loop count in the physical block is employed as the writing loop count Lw of the physical block. As the writing loop count Lw and the erasing loop count Le, the latest loop count that is actually monitored is registered.

The controller 10A performs the data transfer control between the host 1 and the NAND memory 20 via the DRAM 30 and includes software that controls each component in the SSD 100A. The controller 10A and the NAND memory 20 are connected by a control I/O line (Ctrl I/O) for inputting and outputting a command, an address, data, and the like, and a ready/busy signal (Ry/By) indicating whether the NAND memory 20 is in a ready state or a busy state is input from the NAND memory 20 to the controller 10A. The controller 10A includes a read-and-write control unit 11, an erasing-loop-count monitoring unit 12, a writing-loop-count monitoring unit 13, and a life managing unit 14.

The read-and-write control unit 11 performs read and write control of data with respect to the NAND memory 20 via a cache region of the DRAM 30 based on the management information stored in the DRAM 30.

The erasing-loop-count monitoring unit 12 obtains the erasing loop count Le of each physical block from the NAND memory 20 at each erasing of the physical block of the NAND memory 20 or at a predetermined cycle or frequency.

Figure 7:
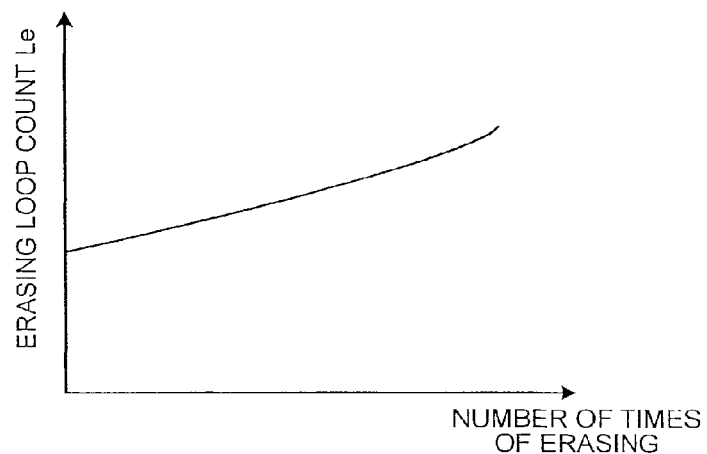
FIG. 7 is a diagram illustrating a relationship between the number of times of erasing and an erasing loop count.

FIG. 7 is a graph illustrating a relationship between the number of times of erasing and the erasing loop count Le. This graph is obtained by averaging inspection data for a plurality of the physical blocks and indicates that the erasing loop count Le is small in the initial state but increases as the number of times of erasing increases. Therefore, the degradation degree of a block can be recognized from the erasing loop count Le, so that the erasing loop count Le can be used as a reference of life determination of the SSD 100A.

Figure 8:
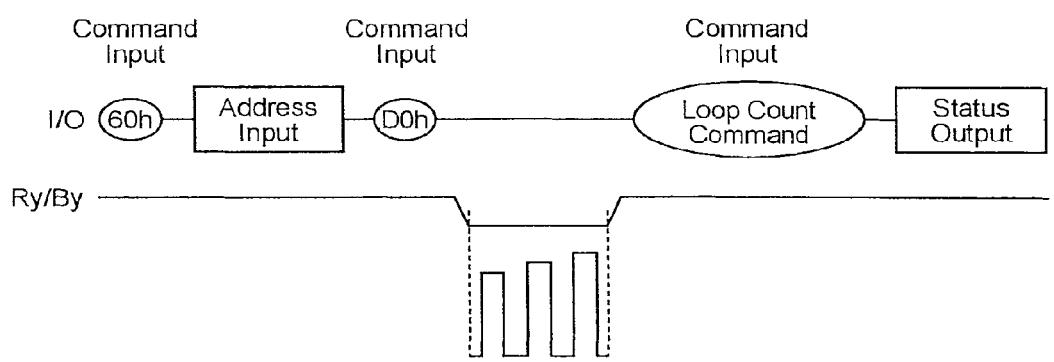
FIG. 8 is a time chart illustrating an operation sequence of erase processing.

FIG. 8 is a time chart illustrating an operation sequence of the erase processing according to the first embodiment. In the erase processing, a command "60h" indicating erasing, an address, and a command "D0h" are input via the control I/O line and the erase processing is performed. A ready/busy signal (Ry/By) falls to busy during execution of the erase processing. A predetermined applied voltage is input to the NAND memory 20 a plurality of times while gradually increasing the applied voltage during execution of the erase processing. When the erase processing is finished, the ready/busy signal (Ry/By) rises to ready. When the erasing-loop-count monitoring unit 12 detects that the ready/busy signal (Ry/By) rises to ready, the erasing-loop-count monitoring unit 12 inputs a command "Loop Count Command" via the control I/O line. In response to the command "Loop Count Command", the NAND memory 20 outputs a status signal (such as the erasing loop count Le and normal termination/abnormal termination) with respect to the last erase processing.

In the NAND memory 20, the ready/busy signal (Ry/By) after the erase command "60h" is input is monitored and the number of voltage applications to a block of the NAND memory 20 from the time the ready/busy signal (Ry/By) falls to busy to the time the ready/busy signal (Ry/By) rises to ready is counted as the erasing loop count Le (erase pulse count), and the NAND memory 20 sends the counted erasing loop count Le to the erasing-loop-count monitoring unit 12 as the status signal. The erasing-loop-count monitoring unit 12 registers (additionally writes) the erasing loop count Le from the NAND memory 20 in an entry of a corresponding physical block in the loop count management table 31.

The writing-loop-count monitoring unit 13 obtains a page writing loop count Lwp that is the loop count at the time of writing of each physical page from the NAND memory 20 at each writing to the physical page or at a predetermined cycle or frequency.

Figure 9:
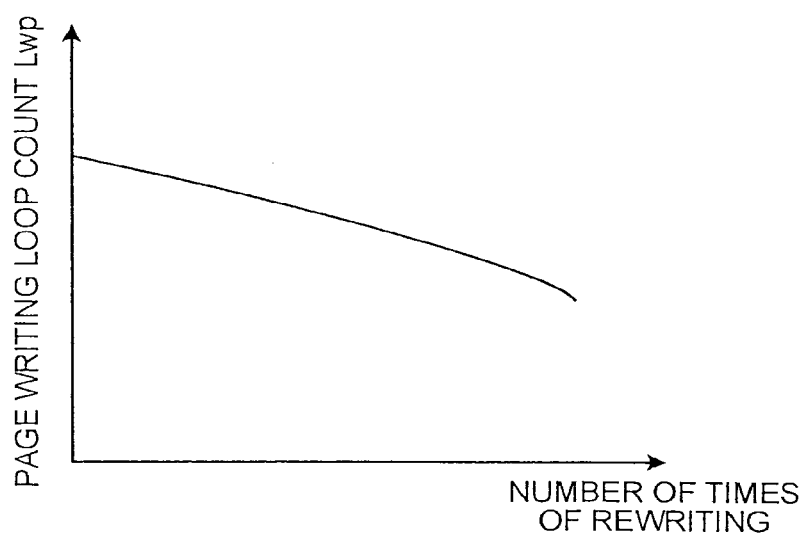
FIG. 9 is a diagram illustrating a relationship between the number of times of rewriting and a page writing loop count.

FIG. 9 is a graph illustrating a relationship between the number of times of rewriting and the page writing loop count Lwp. This graph is obtained by averaging inspection data for a plurality of the physical pages and indicates that the page writing loop count Lwp gradually decreases as the number of times of rewriting increases. Therefore, the degradation degree of a block can be recognized from the page writing loop count Lwp, so that the page writing loop count Lwp can be used as a reference of the life determination of the SSD 100A.

Figure 10:
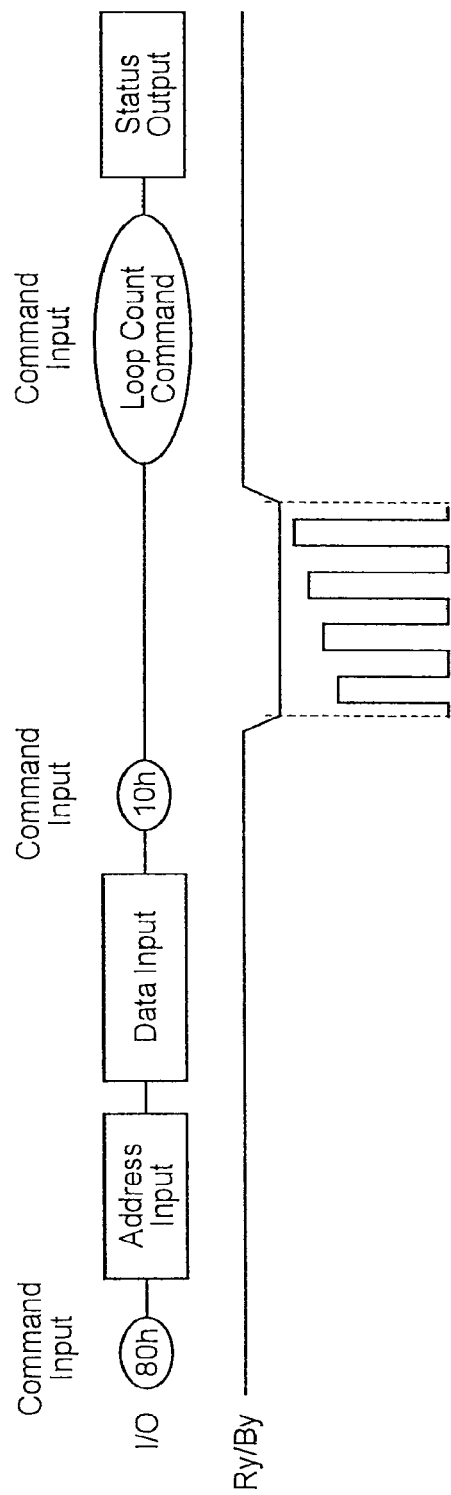
FIG. 10 is a time chart illustrating an operation sequence of write processing.

FIG. 10 is a time chart illustrating an operation sequence of the write processing according to the first embodiment. In the write processing, a command "80h" indicating writing, an address, data, and a command "10h" are input via the control I/O line and the write processing is performed. The ready/busy signal (Ry/By) falls to busy during execution of the write processing. When the write processing is finished, the ready/busy signal (Ry/By) rises to ready. When the writing-loop-count monitoring unit 13 detects that the ready/busy signal (Ry/By) rises to ready, the writing-loop-count monitoring unit 13 inputs the command "Loop Count Command" via the control I/O line. In response to the command "Loop Count Command", the NAND memory 20 outputs a status signal (such as the page writing loop count Lwp and normal termination/abnormal termination) with respect to the last write processing.

In the NAND memory 20, the ready/busy signal (Ry/By) after the write command "80h" is input is monitored and the number of voltage applications to the memory cell of the NAND memory 20 from the time the ready/busy signal (Ry/By) falls to busy to the time the ready/busy signal (Ry/By) rises to ready is counted as the page writing loop count Lwp (program pulse count), and the NAND memory 20 sends the counted page writing loop count Lwp to the writing-loop-count monitoring unit 13 as the status signal.

The writing-loop-count monitoring unit 13 receives the page writing loop count Lwp of each page from the NAND memory 20 and converts the received page writing loop count Lwp of each page into the writing loop count Lw in physical block unit. As a method of determining the writing loop count Lw in physical block unit, the smallest page writing loop count (page whose aging change is the largest) is employed as the writing loop count Lw of the physical block. In the writing-loop-count monitoring unit 13, the derived writing loop count Lw is registered in an entry of a corresponding physical block in the loop count management table 31.

Figure 11:
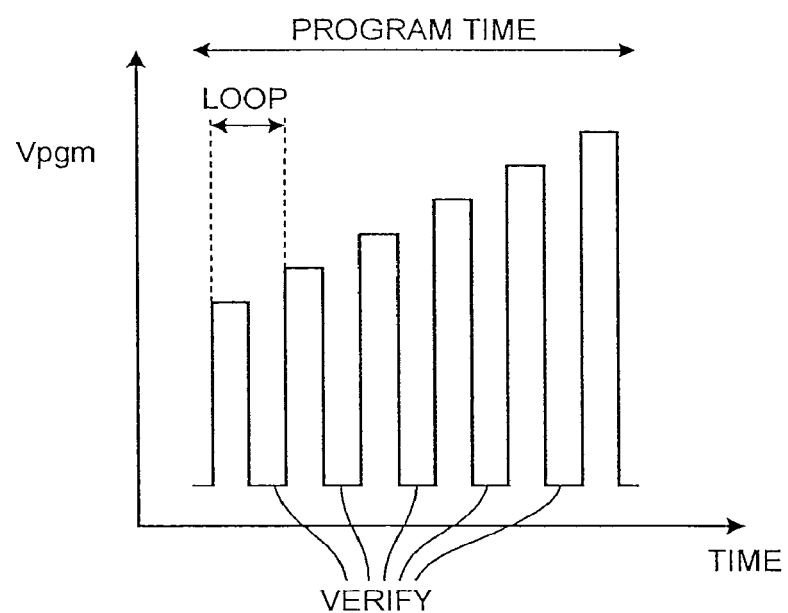
FIG. 11 is a time chart illustrating an applying operation of a write voltage.

At the time of writing, as shown in FIG. 11, every time a write voltage Vpgm is applied to the memory cell, a verifying operation is performed to check whether the writing is performed normally, and when the writing is not performed normally, increase of the write voltage Vpgm and the verifying operation are repeatedly performed until normal writing is performed or until a time-out. The writing-loop-count monitoring unit 13 obtains this loop count as the page writing loop count Lwp.

At the time of erasing, a repeat control of erase voltage application and verifying is performed in the similar manner. The erasing-loop-count monitoring unit 12 obtains the loop count at the erase processing as the erasing loop count Le.

The life managing unit 14 determines the life of the SSD 100A based on registered data in the loop count management table 31, and, when it is determined that the SSD 100A has reached a predetermined degraded state, outputs a warning indication indicating that effect to the host 1 and the warning output unit 21 as an external device of the SSD 100A. The life managing unit 14 determines whether the SSD 100A has reached the predetermined degraded state at each erasing of the physical block of the NAND memory 20 or at a predetermined cycle or frequency.

The life of the SSD 100A can be determined by using any one of the writing loop count Lw for each block and the erasing loop count Le for each block. Therefore, when performing the life determination, it is determined in advance whether to use any one or both of the writing loop count Lw and the erasing loop count Le depending on a type of a device. When the life of the SSD 100A is determined by using the writing loop count Lw, the erasing-loop-count monitoring unit 12 and the erasing loop count Le in the loop count management table 31 are not needed. When the life of the SSD 100A is determined by using the erasing loop count Le, the writing-loop-count monitoring unit 13 and the writing loop count Lw in the loop count management table 31 are not needed.

The life managing unit 14 determines whether the SSD 100A has reached the predetermined degraded state (life is approaching) by any one of the following determination methods 1 to 8 or a method in which the determination methods 1 to 8 are combined.

(Determination Method 1)

The life managing unit 14 calculates the number of the physical blocks whose writing loop count Lw is smaller than a threshold (lower limit Wmin to be described later) for a state management used in a state determination of each physical block among the physical blocks registered in the loop count management table 31. In other words, the life managing unit 14 calculates the number of the physical blocks whose writing loop count Lw is smaller than the lower limit Wmin among the physical blocks registered in the loop count management table 31. When the calculated number of the physical blocks becomes larger than a threshold (allowable number of blocks Bnw1 for SSD life determination) for life management used in the life determination of the SSD 100A, the life managing unit 14 determines that the SSD 100A has reached the predetermined degraded state.

(Determination Method 2)

When the ratio between the total number of the blocks of the NAND memory 20 and the number of the physical blocks calculated by the determination method 1 becomes larger than a threshold (block ratio Brw1 for SSD life determination) (for example, 80%) for the life management used in the life determination of the SSD 100A, the life managing unit 14 determines that the SSD 100A has reached the predetermined degraded state.

(Determination Method 3)

The life managing unit 14 calculates the number of the physical blocks whose erasing loop count Le is larger than a threshold (upper limit Emax to be described later) for the state management used in the state determination of each physical block among the physical blocks registered in the loop count management table 31. When the calculated number of the physical blocks becomes larger than a threshold (allowable number of blocks Bne for SSD life determination) for the life management used in the life determination of the SSD 100A, the life managing unit 14 determines that the SSD 100A has reached the predetermined degraded state.

(Determination Method 4)

When the ratio between the total number of the blocks of the NAND memory 20 and the number of the physical blocks calculated by the determination method 3 becomes larger than a threshold (block ratio Bre for SSD life determination) for the life management used in the life determination of the SSD 100A, the life managing unit 14 determines that the SSD 100A has reached the predetermined degraded state.

The total number of the blocks of the NAND memory 20 in the determination method 2 and the determination method 4 can be a region in which valid physical blocks and a spare region are summed up or can be any one of the valid physical blocks and the spare region. In the NAND-type flash memory, typically, the minimum value of the number of valid (Valid/Good) blocks to be ensured over the lifetime of a device is defined. In this case, the number of blocks in the spare region can be defined as the number of blocks more than the minimum number of valid blocks to be ensured. Alternatively, in the memory system such as the SSD, the physical blocks more than the number appeared as a data capacity from the outside are provided for management, replacement, and buffering in some cases. In this case, the number of blocks in the spare region can be defined as the number of blocks more than the number of blocks appeared as the data capacity from the outside.

(Determination Method 5)

The life managing unit 14 calculates the average of the writing loop counts Lw of the physical blocks registered in the loop count management table 31. When the calculated average of the writing loop counts Lw becomes smaller than a threshold (threshold Taw for SSD life determination) for the life management used in the life determination of the SSD 100A, the life managing unit 14 determines that the SSD 100A has reached the predetermined degraded state.

(Determination Method 6)

The life managing unit 14 calculates the average of the erasing loop counts Le of the physical blocks registered in the loop count management table 31. When the calculated average of the erasing loop counts Le becomes larger than a threshold (threshold Tae for SSD life determination) for the life management used in the life determination of the SSD 100A, the life managing unit 14 determines that the SSD 100A has reached the predetermined degraded state.

(Determination Method 7)

The life managing unit 14 calculates the minimum value or the maximum value of the writing loop count Lw from among the writing loop counts Lw of the physical blocks registered in the loop count management table 31. When the calculated minimum value or maximum value of the writing loop count Lw becomes smaller than a threshold (threshold Tmw for SSD life determination) for the life management used in the life determination of the SSD 100A, the life managing unit 14 determines that the SSD 100A has reached the predetermined degraded state. Whereby, it is possible to determine that the SSD 100A has reached the life thereof based on comparison of the physical block whose aging degradation is determined to be the smallest or the physical block whose aging degradation is determined to be the largest based on the writing loop counts Lw and the threshold for the life management.

(Determination Method 8)

The life managing unit 14 calculates the minimum value or the maximum value of the erasing loop count Le from among the erasing loop counts Le of the physical blocks registered in the loop count management table 31. When the calculated minimum value or maximum value of the erasing loop count Le becomes larger than a threshold (threshold Tme for SSD life determination) for the life management used in the life determination of the SSD 100A, the life managing unit 14 determines that the SSD 100A has reached the predetermined degraded state. Whereby, it is possible to determine that the SSD 100A has reached the life thereof based on comparison of the physical block whose aging degradation is determined to be the smallest or the physical block whose aging degradation is determined to be the largest based on the erasing loop counts Le and the threshold for the life management.

The warning output unit 21 is, for example, a display device such as a liquid crystal monitor. The warning output unit 21 can be an audio output device or an illumination device such as an LED (Light Emitting Diode). When the warning output unit 21 is the audio output device, the warning output unit 21 outputs warning by audio output, and when the warning output unit 21 is the illumination device, the warning output unit 21 outputs warning by lighting or flashing the illumination device.

Figure 12:
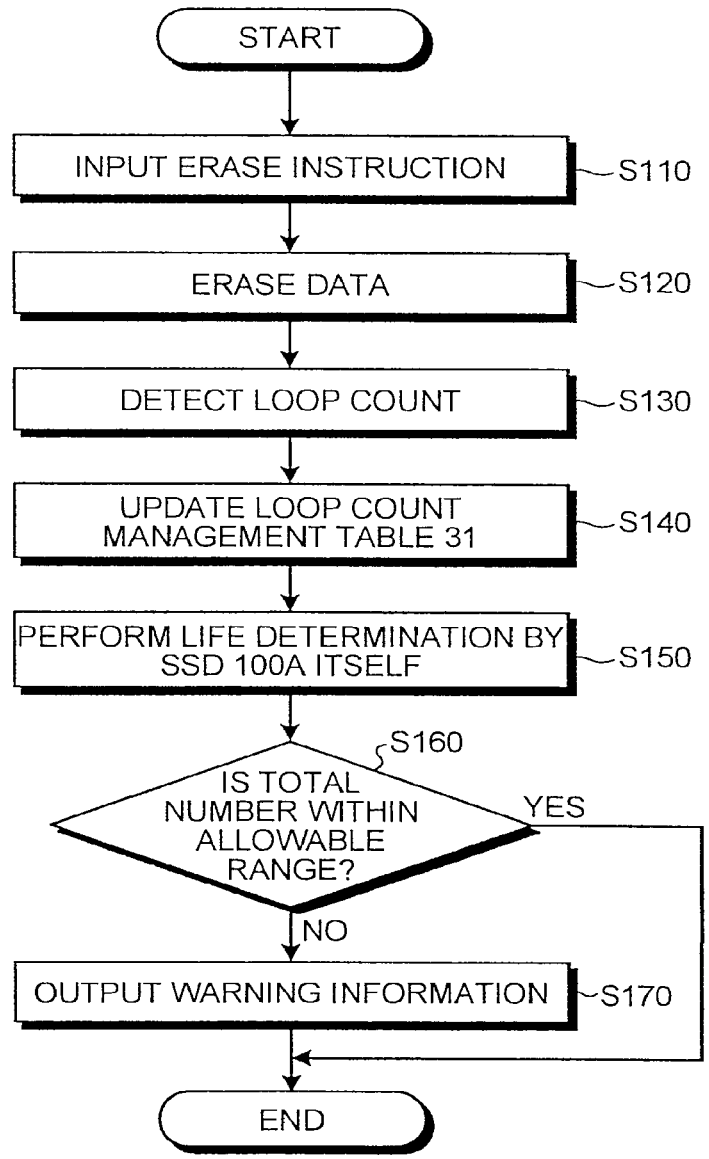
FIG. 12 is a flowchart illustrating a life determination processing procedure of the SSD according to the first embodiment.

Next, a life determination processing procedure of the SSD 100A by the SSD 100A itself is explained. FIG. 12 is a flowchart illustrating the life determination processing procedure of the SSD according to the first embodiment. In this example, explanation is given for the case of performing the life determination of the SSD 100A based on the erasing loop count Le; however, the life determination of the SSD 100A can be performed by the similar processing procedure in the case of performing the life determination of the SSD 100A based on the writing loop count Lw.

The erase processing between the host 1 and the SSD 100A is performed in accordance with the operation sequence of the erase processing shown in FIG. 8. Specifically, an erase instruction is sent from the controller 10A to the NAND memory 20, and the erase instruction is input to the NAND memory 20 (Step S110). Whereby, the erase processing of data is performed on a block specified by the erase instruction from the controller 10A among the blocks of the NAND memory 20 (Step S120).

In the erase processing, the erasing-loop-count monitoring unit 12 detects the number of voltage applications to the block that is an erase target as the erasing loop count Le (Step S130), and registers the detected erasing loop count Le in the entry of a corresponding physical block in the loop count management table 31. Whereby, the loop count management table 31 is updated (Step S140).

Thereafter, the life managing unit 14 determines the life of the SSD 100A based on registered data in the loop count management table 31. In other words, the SSD 100A itself performs the life determination of the SSD 100A (Step S150). The life managing unit 14 in the present embodiment determines whether the SSD 100A has reached the predetermined degraded state by any of the above described determination methods 1 to 8.

In this example, explanation is given for the case where the life managing unit 14 determines whether the SSD 100A has reached the predetermined degraded state by using the above described determination method 1 or 3. The life managing unit 14 determines whether the NAND memory 20 has reached the predetermined degraded state by using a threshold (block threshold information 32 to be described later) for the state management used in the state determination for each physical block.

Figures 13, 14:
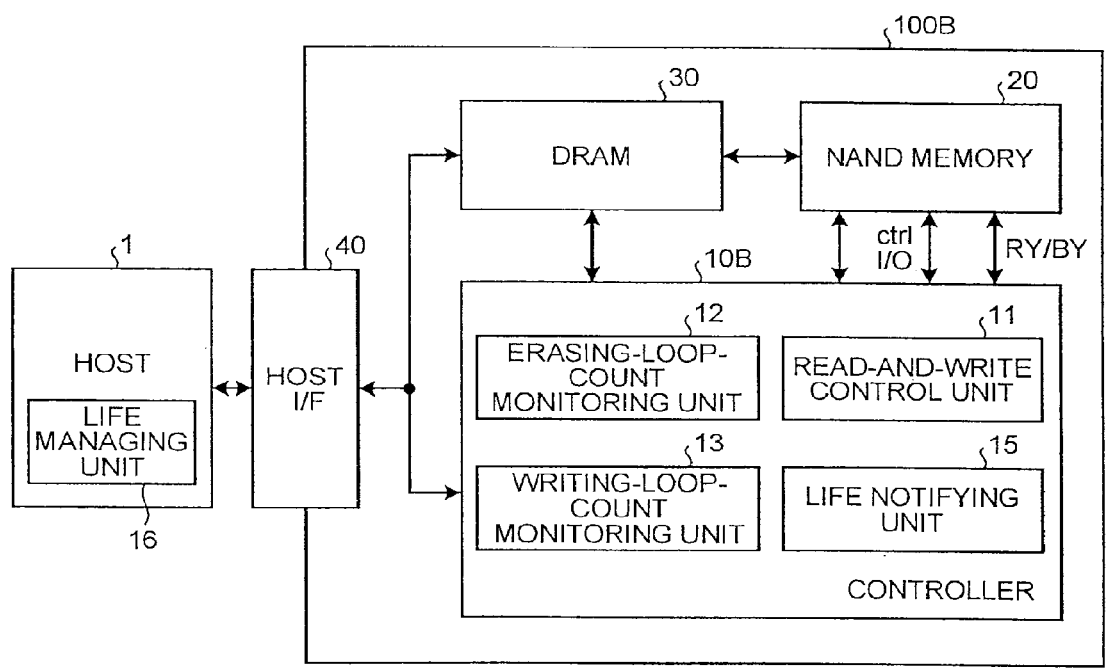
FIG. 13 is a diagram illustrating block threshold information used in a state determination of a block.
FIG. 14 is a functional block diagram illustrating a functional configuration example of an SSD according to a second embodiment.

FIG. 13 is a diagram illustrating the block threshold information used in the state determination of a block. In the NAND memory 20, a threshold (allowable range) used for determining the degraded state of the SSD 100A is registered in advance in the block threshold information 32.

The lower limit Wmin and the upper limit Wmax are registered in the block threshold information 32 as the allowable range of the writing loop count Lw. Moreover, a lower limit Emin and an upper limit Emax are registered in the block threshold information 32 as the allowable range of the erasing loop count Le. The allowable range of the writing loop count Lw and the allowable range of the erasing loop count Le are set in advance by referring to device characteristics and the like of the NAND memory 20 (memory element).

The life managing unit 14, for example, refers to the block threshold information 32 and determines the life of the SSD 100A in accordance with the determination method 1. In this case, the life managing unit 14 calculates the sum value of the number of the physical blocks whose writing loop count Lw is smaller than the lower limit Wmin and the number of the physical blocks whose writing loop count Lw is larger than the upper limit Wmax (for example, the writing loop count Lw at the initial state) among the physical blocks registered in the loop count management table 31.

In the present embodiment, the number of the physical blocks whose writing loop count Lw is larger than the upper limit Wmax is used for the life determination of the SSD 100A in addition to the lower limit Wmin. This is because it is highly likely that a block whose writing loop count Lw is larger than the upper limit Wmax has some abnormality.

The life managing unit 14 determines whether the calculated total number of the physical blocks is within the allowable range (Step S160). Specifically, the life managing unit 14 determines that the SSD 100A has reached the predetermined degraded state when the calculated total number of the physical blocks becomes larger than the allowable number of blocks Bnw1 for SSD life determination.

When the life managing unit 14 determines that the SSD 100A has reached the predetermined degraded state, the life managing unit 14 outputs warning indicating that effect to the warning output unit 21 and the like. In other words, when the calculated total number of the physical blocks is not within the allowable range (No at Step S160), the life managing unit 14 outputs warning to the warning output unit 21 and the like (Step S170). On the other hand, when the calculated total number of the physical blocks is within the allowable range (Yes at Step S160), the life managing unit 14 ends the life determination without outputting the warning.

Moreover, for example, the life managing unit 14 can refer to the block threshold information 32 and determine the life of the SSD 100A in accordance with the determination method 3. In this case, the life managing unit 14 calculates the sum value of the number of the physical blocks whose erasing loop count Le is smaller than the lower limit Emin (for example, the erasing loop count Le at the initial state) and the number of the physical blocks whose erasing loop count Le is larger than the upper limit Emax among the physical blocks registered in the loop count management table 31.

In the present embodiment, the number of the physical blocks whose erasing loop count Le is smaller than the lower limit Emin is used for the life determination of the SSD 100A in addition to the upper limit Emax. This is because it is highly likely that a block whose erasing loop count Le is smaller than the lower limit Emin has some abnormality.

The life managing unit 14 determines that the SSD 100A has reached the predetermined degraded state when the calculated total number of the physical blocks becomes larger than the allowable number of blocks Bne for SSD life determination. When the life managing unit 14 determines that the SSD 100A has reached the predetermined degraded state, the life managing unit 14 outputs warning indicating that effect to the warning output unit 21 and the like.

When the life determination of the SSD 100A is performed by the determination method 1, 2, 5, or 7, the lower limit Emin and the upper limit Emax of the erasing loop count Le are not needed. When the life determination of the SSD 100A is performed by the determination methods 3, 4, 6, or 8, the lower limit Wmin and the upper limit Wmax of the writing loop count Lw are not needed.

Moreover, it is applicable to perform the life determination of the SSD 100A based on the number of the physical blocks whose writing loop count Lw is smaller than the lower limit Wmin without using the number of the physical blocks whose writing loop count Lw is larger than the upper limit Wmax. In this case, the upper limit Wmax of the writing loop count Lw is not needed.

Furthermore, it is applicable to perform the life determination of the SSD 100A based on the number of the physical blocks whose erasing loop count Le is larger than the upper limit Emax without using the number of the physical blocks whose erasing loop count Le is smaller than the lower limit Emin. In this case, the lower limit Emin of the erasing loop count Le is not needed.

Moreover, in the present embodiment, the case is explained in which the writing loop count Lw is the worst value of the loop count at the time of writing; however, the page writing loop count Lwp of a predetermined physical page can be set to the writing loop count Lw of the physical block.

Furthermore, the life managing unit 14 can determine the life of the SSD 100A by a method other than the above described determination methods 1 to 8. Moreover, the loop count management table 31 and the block threshold information 32 can be stored in the NAND memory 20 or the DRAM 30. Furthermore, in the present embodiment, the case is explained in which the warning output unit 21 is arranged outside the SSD 100A; however, the warning output unit 21 can be arranged in the SSD 100A.

Moreover, the type of the command and the command number used in the erase processing and the write processing explained in FIG. 8, FIG. 10, and the like are one example, and the erase processing and the write processing can be performed by other commands.

In this manner, in the first embodiment, the life of the SSD 100A is determined based on the erasing loop count Le and/or the writing loop count Lw that are actually monitored, correct life determination can be performed without depending on variation between lots, individuals, blocks, and the like. Accordingly, the degraded state of the whole nonvolatile semiconductor memory that includes a plurality of blocks can be correctly detected.

Moreover, because the controller 10A includes the life managing unit 14, the SSD 100A can determine the life of the SSD 100A by itself. Furthermore, because the SSD 100A itself outputs the warning indication related to the life of the SSD 100A, it is possible to notify a user of warning related to the life of the SSD 100A while reducing the load on the host 1.

(Second Embodiment)

Next, the memory system according to the second embodiment is explained. In the second embodiment, the loop count management table 31 is sent from the SSD (SSD 100B to be described later) to the host 1 that is an external device and the host 1 performs the life determination of the SSD 100B.

FIG. 14 is a functional block diagram illustrating a functional configuration example of the SSD according to the second embodiment of the present invention. Components that achieve the same function as the SSD 100A shown in FIG. 5 among components in FIG. 14 are given the same reference numerals and overlapping explanation is omitted. The host 1 in the present embodiment includes a life managing unit 16. The life managing unit 16 has a function similar to the life managing unit 14 included in the SSD 100A explained in the first embodiment.

The SSD 100B as the memory system shown in FIG. 14 includes a controller 10B, the NAND memory 20, the DRAM 30, and the host I/F 40. The controller 10B has a function approximately similar to the controller 10A, and is different from the controller 10A in that the controller 10B does not include the life managing unit 14 but includes a life notifying unit 15. Specifically, the controller 10B includes the read-and-write control unit 11, the erasing-loop-count monitoring unit 12, the writing-loop-count monitoring unit 13, and the life notifying unit 15.

When a request for the loop count management table 31 is issued from the host 1, the life notifying unit 15 of the SSD 100B reads out the loop count management table 31 from the NAND memory 20 and sends it to the host 1. The request for the loop count management table 31 from the host 1 to the SSD 100B is made, for example, by a SMART (Self-Monitoring Analysis and Reporting Technology) command. The SMART command is a request command for the host 1 extracting the state of the NAND memory 20 and the like. The host 1 can read out the loop count management table 31 from the NAND memory 20 via the DRAM 30.

Figure 15:
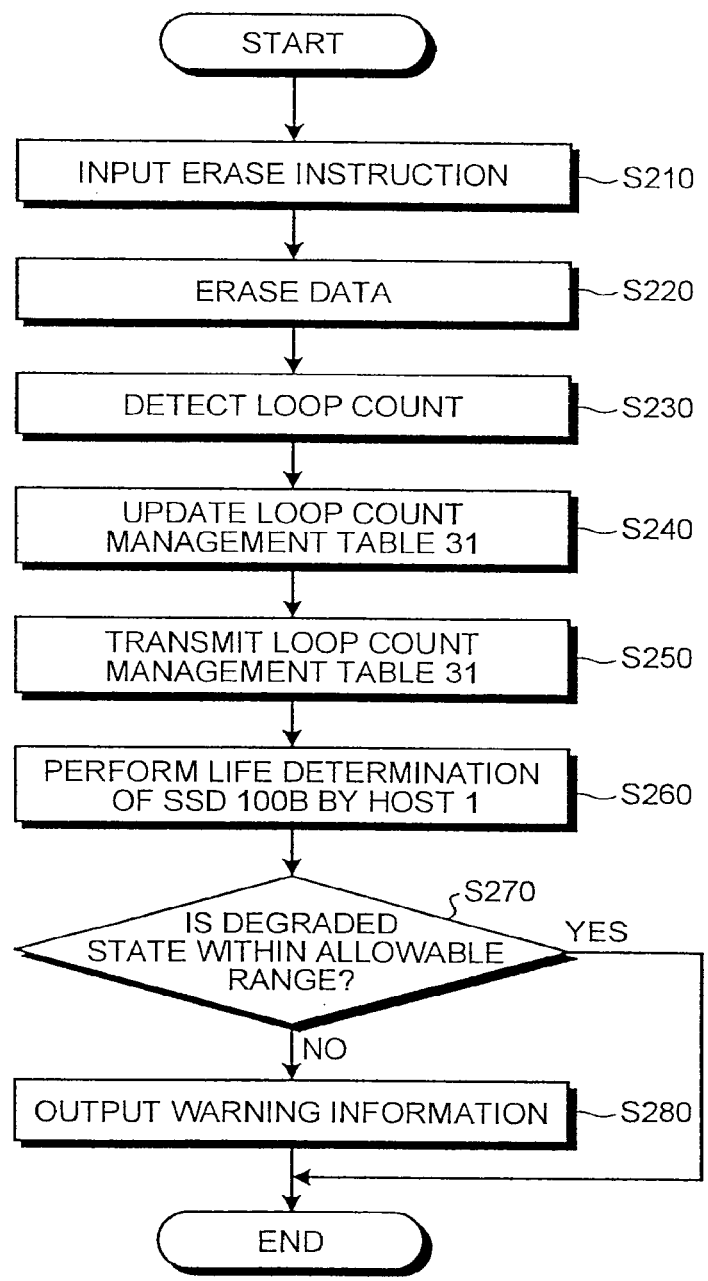
FIG. 15 is a flowchart illustrating a life determination processing procedure of the SSD according to the second embodiment.

Next, the life determination processing procedure of the SSD 100B by the host 1 is explained. FIG. 15 is a flowchart illustrating the life determination processing procedure of the SSD according to the second embodiment. In the processing procedure in FIG. 15, overlapping explanation is omitted for the processing procedure similar to the processing procedure shown in FIG. 12.

In the processing shown in FIG. 15, processing from input processing of an erase instruction from the controller 10B to the NAND memory 20 to update processing of the loop count management table 31 is similar to the processing shown in FIG. 12. In other words, processing at Steps S210 to S240 shown in FIG. 15 is similar to the processing at Step S110 to S140 shown in FIG. 12.

The host 1 makes a request for the loop count management table 31 to the SSD 100B at an arbitrary timing. When the request for the loop count management table 31 is issued from the host 1, the life notifying unit 15 reads out the loop count management table 31 from the NAND memory 20 and transmits it to the host 1 (Step S250). The life managing unit 16 of the host 1 performs the life determination of the SSD 100B by the processing similar to the life managing unit 14 explained in the first embodiment (Step S260). Then, when the degraded state of the SSD 100B is not within the allowable range (No at Step S270), warning is output to the warning output unit 21 (not shown in FIG. 14) and the like (Step S280). On the other hand, when the degraded state of the SSD 100B is within the allowable range (Yes at Step S270), the life managing unit 16 ends the life determination without outputting the warning.

Information on the loop count at the time of writing registered in the loop count management table 31 is not limited to the writing loop count Lw that is the worst value (minimum value) of the loop count at the time of writing.

FIG. 16 is a diagram illustrating another configuration example of the loop count management table. A loop count management table 33 is a table for managing a writing loop count average value La that is the average of the page writing loop counts Lwp in a block, the number of written pages P that is the number of written pages in a block, and the erasing loop count Le, in physical block unit. As the writing loop count average value La, the number of written pages P, and the erasing loop count Le, the latest loop count and number of pages that are actually monitored are registered.

Data writing is performed on each block in page unit. Therefore, even when writing to a new page is performed, a new writing loop count average value La can be easily calculated by storing the writing loop count average value La and the number of written pages P in the loop count management table 33.

Explanation is given for the life determination processing of the SSD 100B using the loop count management table 33. The host 1 determines whether the SSD 100B has reached the predetermined degraded state (life is approaching) by any of the following determination methods 9 and 10 or a method in which the determination methods 9 and 10 are combined.

(Determination Method 9)

The life managing unit 16 calculates the number of the physical blocks whose writing loop count average value La is smaller than a threshold (threshold Aw for average value) for the state management used in the state determination of each physical block among the physical blocks registered in the loop count management table 33. When the calculated number of the physical blocks becomes larger than a threshold (allowable number of blocks Bnw2 for SSD life determination) for the life management used in the life determination of the SSD 100B, the life managing unit 16 determines that the SSD 100B has reached the predetermined degraded state.

(Determination Method 10)

When the ratio between the total number of the blocks of the NAND memory 20 and the number of the physical blocks calculated by the determination method 9 becomes larger than a threshold (block ratio Brw2 for SSD life determination) for the life management used in the life determination of the SSD 100B, the life managing unit 16 determines that the SSD 100B has reached the predetermined degraded state.

The life managing unit 16 can determine the life of the SSD 100B by using the determination methods 5 and 6 or can determine the life of the SSD 100B by a method in which the determination methods 1 to 10 are combined. When the life managing unit 14 of the SSD 100A performs the life determination of the SSD 100A by using the loop count management table 33, the life determination is performed by a method similar to the life determination of the SSD 100B by the host 1.

Moreover, each of the allowable range of the writing loop count Lw and the allowable range of the erasing loop count Le used in the state determination of each physical block is not limited to one but can be two or more. When N (N is a natural number) allowable ranges are used, the state determination of N stages can be performed. Specifically, the life managing unit 16 determines which degraded stage the degraded state of each physical block is in among a plurality of degraded stages correlated with the allowable ranges, respectively, based on which allowable range the degraded state is in among the N allowable ranges. In this example, explanation is given for the case where two allowable ranges are set for each loop count. For example, a first allowable range and a second allowable range are set in advance for the writing loop count Lw. Then, when the writing loop count Lw exceeds the first allowable range, it is determined that the state of the physical block is degraded a little. Moreover, when the writing loop count Lw exceeds the second allowable range, it is determined that the state of the physical block is degraded greatly.

FIG. 17 is a diagram illustrating block threshold information when the state determination of a block is performed in two stages. In block threshold information 34, a first lower limit Wmin1, a first upper limit Wmax1, a second lower limit Wmin2, and a second upper limit Wmax2 are registered as the allowable ranges of the writing loop count Lw. In the block threshold information 32, a first lower limit Emin1, a first upper limit Emax1, a second lower limit Emin2, and a second upper limit Emax2 are registered as the allowable ranges of the erasing loop count Le.

In the allowable range of the writing loop count Lw, the second lower limit Wmin2 is a condition severer than the first lower limit Wmin1 and the second upper limit Wmax2 is a condition severer than the first upper limit Wmax1. In the allowable range of the erasing loop count Le, the second lower limit Emin2 is a condition severer than the first lower limit Emin1 and the second upper limit Emax2 is a condition severer than the first upper limit Emax1.

For example, the life managing unit 16 refers to the block threshold information 34 and determines the life of the SSD 100B in accordance with the determination method 1. In this case, the life managing unit 16 calculates the sum value of the number of the physical blocks whose writing loop count Lw is smaller than the first lower limit Wmin1 and the number of the physical blocks whose writing loop count Lw is larger than the first upper limit Wmax1 among the physical blocks registered in the loop count management table 31.

When the calculated total number of the physical blocks is larger than the allowable number of blocks Bnw1 for SSD life determination, the life managing unit 16 determines that the degraded state of the SSD 100B has reached the degraded state of the first stage.

Moreover, the life managing unit 16 calculates the sum value of the number of the physical blocks whose writing loop count Lw is smaller than the second lower limit Wmin2 and the number of the physical blocks whose writing loop count Lw is larger than the second upper limit Wmax2 among the physical blocks registered in the loop count management table 31.

When the calculated total number of the physical blocks is larger than the allowable number of blocks Bnw1 for SSD life determination, the life managing unit 16 determines that the degraded state of the SSD 100B has reached the degraded state of the second stage (state in which degradation has progressed more than the first stage).

In this example, explanation is given for the case of setting a plurality of the allowable ranges of the writing loop count Lw and a plurality of the allowable ranges of the erasing loop count Le used for the state determination of each physical block; however, a plurality of thresholds (such as the allowable number of blocks Bnw1 for SSD life determination) for the life management used in the life determination of the SSD 100B can be set. For example, when the number of the physical blocks calculated by the determination method 1 is larger than the first threshold for the life management used in the life determination of the SSD 100B, it is determined that the degraded state of the SSD 100B has reached the first stage. When the number of the physical blocks calculated by the determination method 1 is larger than the second threshold for the life management used in the life determination of the SSD 100B, it is determined that the degraded state of the SSD 100B has reached the second stage (state in which the life becomes shorter than the first stage).

In the present embodiment, the configuration is such that the host 1 includes the life managing unit 16; however, the life managing unit 16 can be included in an external device other than the host 1. Moreover, when the life determination of the SSD 100A is performed by the life managing unit 14 using the block threshold information 34, the life managing unit 14 performs the life determination of the SSD 100A by the processing similar to the above host 1.

In this manner, in the second embodiment, because the SSD 100B includes the life notifying unit 15, the loop count management table 31 can be transmitted to the host 1. Moreover, because the host 1 includes the life managing unit 16, the host 1 can determine the life of the SSD 100B. Furthermore, a plurality of the allowable ranges of the erasing loop count Le and a plurality of the allowable ranges of the writing loop count Lw used in the state determination of each physical block are set, so that the degraded state of the SSD 100B can be managed in detail.

In this manner, according to the first embodiment and the second embodiment, the degraded state of the whole nonvolatile semiconductor memory can be detected correctly.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A system comprising:
    a semiconductor nonvolatile memory configured to store data;
    a management unit; and
    a control unit con figured to input a first voltage to a specific block of the semiconductor nonvolatile memory a plurality of times in response to a single write command and input a second voltage to a specific block of the semiconductor nonvolatile memory a plurality of times in response to a single erase command, wherein
    the semiconductor nonvolatile memory includes:
        a first area configured to store data from a host; and
        a second area that includes blocks for at least one of management, replacement, and buffering,
    the management unit is configured to determine, on the basis of first information or second information, degradation of a block in the second area, the first information being information regarding first processing, the first processing being performed in the data writing, the second information being information regarding second processing, the second processing being performed in the data erasing, and
    when a number of blocks related to the degradation in the second area reaches a first threshold, the management unit causes a display device to display a warning.

2. The system according, to claim 1, wherein
    the management unit monitors a writing loop count of the first voltage or monitors an erasing loop count of the second voltage, and
    the management unit counts, on the basis of the writing loop count or the erasing loop count, the number of blocks related to the degradation in the second area.

3. The system according to claim 2, wherein
    the first information is a number of blocks that have the writing loop count smaller than a second threshold, and
    the second information is a number of blocks that have the erasing loop count larger than a third threshold.

4. The system according to claim 1, wherein
    the management unit monitors a writing loop count of the first voltage or monitors an erasing loop count of the second voltage, and
    the management determines, on the basis of the writing loop count or the erasing loop count, degradation of the semiconductor nonvolatile memory.

5. The system according to claim 2, wherein
    the block includes a plurality of pages, the plurality of pages being units of the data writing and the data reading,
    the first information is the writing loop count of a page that has a smallest writing loop count in the block, and
    the second information is a number of blocks that have the erasing , loop count larger than a third threshold.

6. The system according to claim 1, wherein in the data writing, the control unit inputs the first voltage to the semiconductor nonvolatile memory a plurality of times while the first voltage is gradually increased.

7. The system according to claim 1, wherein
    in the data erasing, the control unit inputs the second voltage to the semiconductor nonvolatile memory a plurality of times while the second voltage is gradually increased.

8. The system according to claim 1, wherein
    the semiconductor nonvolatile memory further includes a third area, the third area being configured to store management information of the second area, and
    when a request is issued from the host, the management unit transmits, to the host, the management information of the second area.

9. The system according to claim 1, wherein
    after the first voltage is input, the control unit performs a verifying operation to check whether the data writing is performed normally, and
    when the data writing is not performed normally, the control unit repeatedly performs increase of the first voltage and the verifying operation until the normal writing is performed or until a time-out.

10. The system according to claim 1, wherein, after the second voltage is input, the control unit performs a verifying operation to check whether the data erasing is performed normally, and
    when the data erasing is not performed normally, the control unit repeatedly performs increase of the second voltage and the verifying operation until the normal erasing is performed or until a time-out.

11. A system comprising:
    a semiconductor nonvolatile memory configured to store data;
    a management unit; and
    a control unit configured to input a first voltage to a specific block of the semiconductor nonvolatile memory a plurality of times in response to a single write command and input a second voltage to a specific block of the semiconductor nonvolatile memory a plurality of times in response to a single erase command, wherein
    the semiconductor nonvolatile memory includes:
        a first area configured to store data from a host; and
        a second area that includes blocks for at least one of management, replacement, and buffering,
    the management unit is configured to determine, on the basis of first information or second information, degradation of a block in the second area, the first information being information regarding first processing, the first processing being performed in the data writing, the second information being information regarding second processing, the second processing being performed in the data erasing, and
    when a number of blocks related to the degradation in the second area reaches a first threshold, the management unit registers information that is to be output to an external device.

12. The system according to claim 11, wherein
the management unit monitors a w ting loop count of the first voltage or monitors an erasing loop count of the second voltage, and
the management unit counts, on the basis of the writing loop count or the erasing loop count, the number of blocks related to the degradation in the second area.

13. The system according to claim 12, wherein
the first information is a number of blocks that have the writing loop count smaller than a second threshold, and
the second information is a number of blocks that have the erasing loop count larger than a third threshold.

14. The system according to claim 11, wherein
the management unit monitors a writing loop count of the first voltage or monitors an erasing loop count of the second voltage, and
the management unit determines, on the basis of the writing loop count or the erasing loop count, degradation of the semiconductor nonvolatile memory.

15. The system according to claim 12, wherein
the block includes a plurality of pages, the plurality of pages being units of the data writing and data reading,
the first information is the writing loop count of a page that has a smallest writing loop count in the block, and
the second information is a number of blocks that have the erasing loop count larger than a third threshold.

16. The system according to claim 11, wherein
in the data writing, the control unit inputs the first voltage to the semiconductor nonvolatile memory a plurality of times while the first voltage is gradually increased.

17. The system according to claim 11, wherein
in the data erasing, the control unit inputs the second voltage to the semiconductor nonvolatile memory a plurality of times while the second voltage is gradually increased.

18. The system according to claim 11, wherein
the semiconductor nonvolatile memory further includes a third area, the third area being configured to store management information of the second area, and
when a request is issued from the host, the management unit transmits, to the host, the management information of the second area.

19. The system according to claim 11, wherein
after the first voltage is input, the control unit performs a verifying operation to check whether the data writing is performed normally, and
when the data writing is not performed normally, the control unit repeatedly performs increase of the first voltage and the verifying operation until the normal writing is performed or until a time-out.

20. The system according to claim 11, wherein
after the second voltage is input, the control unit performs a verifying operation to check whether the data erasing is performed normally, and
when the data erasing is not performed normally, the control unit repeatedly performs increase of the second voltage and the verifying operation until the normal erasing is performed or until a time-out.

* * * * *